United States Patent [19]

Yorizumi et al.

[11] 4,331,548
[45] May 25, 1982

[54] FERRITE SINGLE CRYSTAL AND MAGNETIC HEAD CONTAINING THE SAME

[75] Inventors: Mineo Yorizumi; Yoshimi Makino, both of Yokohama, Japan

[73] Assignee: Sony Corporation, Tokyo, Japan

[21] Appl. No.: 263,410

[22] Filed: May 14, 1981

[30] Foreign Application Priority Data

May 16, 1980 [JP] Japan .................................. 55/65143

[51] Int. Cl.$^3$ .......................... C04B 35/38; G11B 5/14
[52] U.S. Cl. ............................... 252/62.61; 252/62.62; 360/127
[58] Field of Search .......................... 252/62.61, 62.62; 360/127

[56] References Cited

U.S. PATENT DOCUMENTS

| | | | |
|---|---|---|---|
| 2,549,089 | 4/1951 | Hegyi ................................. | 252/62.61 |
| 2,986,523 | 5/1961 | Van Der Burgt et al. ....... | 252/62.61 |
| 3,769,219 | 10/1973 | Sugano et al. ................ | 252/62.61 X |
| 3,810,245 | 5/1974 | Ozawa et al. ....................... | 360/127 |
| 3,843,541 | 10/1974 | Chiba et al. .................. | 252/61.61 X |

FOREIGN PATENT DOCUMENTS 51-55996  5/1976  Japan .................................. 252/62.61

OTHER PUBLICATIONS

Agajanian "IBM Technical Disclosure Bulletin", vol. 11, No. 7, Dec. 1968, p. 797.

*Primary Examiner*—Jack Cooper
*Attorney, Agent, or Firm*—Hill, Van Santen, Steadman, Chiara & Simpson

[57] ABSTRACT

This invention relates to a ferrite single crystal represented by the formula:

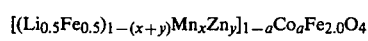

$$[(Li_{0.5}Fe_{0.5})_{1-(x+y)}Mn_xZn_y]_{1-a}Co_aFe_{2.0}O_4$$

where x is in the range from 0.1 to 0.4,
y is in the range from 0.3 to 0.55 and
a is in the range from 0 to 0.015.

The ferrite single crystal is particularly suitable for use in a magnetic head structure.

12 Claims, 12 Drawing Figures

FERRITE SINGLE CRYSTAL AND MAGNETIC HEAD CONTAINING THE SAME

BACKGROUND OF THE INVENTION

1. Field of the Invention

The present invention relates to ferrite single crystals suitable for use in the manufacture of magnetic heads, particularly for video recording. The ferrites of the present invention contain lithium, iron, manganese, zinc, and optionally, cobalt.

2. Description of the Prior Art

Ferrite crystals composed of the Mn—Zn series have been used as suitable materials for magnetic heads. Such single crystals, however, are subject to processing deterioration due to magnetostriction and are likely to cause rubbing noises from the sliding contact between the magnetic tape and the magnetic head. In the case of video heads, such crystals are subject to mechanical distortion caused at the time of processing because of the shortening of tracks on video tapes, so that processing deterioration due to magnetostriction may cause a crucial problem.

Li—Zn series ferrite crystals, on the other hand, have been employed as magnetic head materials because they have a relatively low magnetostriction and have a high specific resistance, hardness and Curie point because of the absence of $Fe^{2+}$ in the crystals, so that they have characteristics which the Mn—Zn series ferrite crystals do not have. The absence of the $Fe^{2+}$ ions in the Li—Zn series single crystals, however, renders the equilibrium oxygen pressure high and such single crystals have such high melting points that it is difficult to grow single crystals from the molten state. Furthermore, ferrites of the Li—Zn series are likely to decompose at high temperatures and react with the material of the crucible, resulting in the evaporation of lithium, so that it is difficult to grow Li—Zn single crystals. The Li—Zn single crystals have heretofore been generally prepared by means of a fluxing method. This method involves melting raw materials constituting the Li—Zn series ferrite in a flux containing lead oxide and boric oxide, and allowing the Li—Zn series ferrite crystals to precipitate in the molten liquid by gradually cooling the liquid at a rate of about 2° C. per hour. This fluxing method, however, presents disadvantages in that the flux may be contaminated in the precipitated crystals, the sizes of the single crystals are small, and the velocity of the crystal growth is slow.

An electromagnetic transducing head employed for video tape recorders has an extremely small size and may consist of a chip having a size, for example, of 2 mm in length, 3 mm in width, and 0.2 mm in thickness. An operating magnetic gap is formed on a portion of the chip which is brought into contact with the magnetic tape. The magnetic head chip has usually been constructed of a ferrite single crystal, having a magnetic gap depth, for example, of about 30 microns. In some cases, the magnetic head may be designed so that the single crystal constitutes both a surface abutting the tape and the operating gap, while other portions of the magnetic path may consist of a combination of the ferrite single crystal and ferrite polycrystals.

Video head chips in such small sizes may be manufactured by subjecting ferrite blocks to processing such as fusion for the formation of winding grooves or gaps and dividing the blocks into video head chips of a predetermined size.

SUMMARY OF THE INVENTION

The present invention seeks to provide a ferrite single crystal which does not possess the disadvantages of conventional ferrite crystals such as those of the Mn—Zn series and the Li—Zn series. It provides a ferrite single crystal which is particularly suitable for use as a material for magnetic heads. The method of preparation of the improved ferrite single crystals of the present invention is relatively straightforward.

The present invention also provides an improved magnetic head which is constructed mainly of a ferrite single crystal.

The advantages of the present invention are provided by a selection of molar ratios within the ferrite so that the following composition is achieved:

$$[(Li_{0.5}Fe_{0.5})_{1-(x+y)}Mn_xZn_y]_{1-a}Co_aFe_{2.0}O_4$$

where x is in the range from 0.1 to 0.4,
y is in the range from 0.3 to 0.55 and
a is in the range from 0 to 0.015.

BRIEF DESCRIPTION OF THE DRAWINGS

Various aspects of the present invention are illustrated in the drawings in which.

DESCRIPTION OF THE PREFERRED EMBODIMENTS

The ferrite single crystals in accordance with the present invention are represented by the following composition:

$$[(Li_{0.5}Fe_{0.5})_{1-(x+y)}Mn_xZn_y]_{1-a}Co_aFe_{2.0}O_4$$

where x is in the range from 0.1 to 0.4,
y is in the range from 0.3 to 0.55, and
a is in the range from 0 to 0.015, and is preferably at least 0.005.

The Li—Fe—Mn—Zn series ferrite single crystals of the present invention in which a is 0 have characteristics present in both the conventional Mn—Zn series and the Li—Zn series ferrite single crystals. Although the absence of $Fe^{2+}$ in the Li—Zn series renders the equilibrium oxygen pressure high, so that the growth of single crystals is difficult, the substitution of a portion of the $Li^+$—$Fe^{3+}$ with $Mn^{2+}$ in the Li—Fe—Mn—Zn series allows the equilibrium oxygen pressure to be lowered without impairing the magnetic properties of the resulting ferrite single crystals and permits the single crystals to be grown easily. This phenomenon is important and enables the growth of a single crystal in the range of practical oxygen partial pressures ranging from about 1 to 5 kg/cm², thereby enabling the use of a floating zone method in a high pressure gas, as will be described hereinafter, and enabling the use of straight-forward and certain procedures for preparing the desired single crytals.

Figure 1:
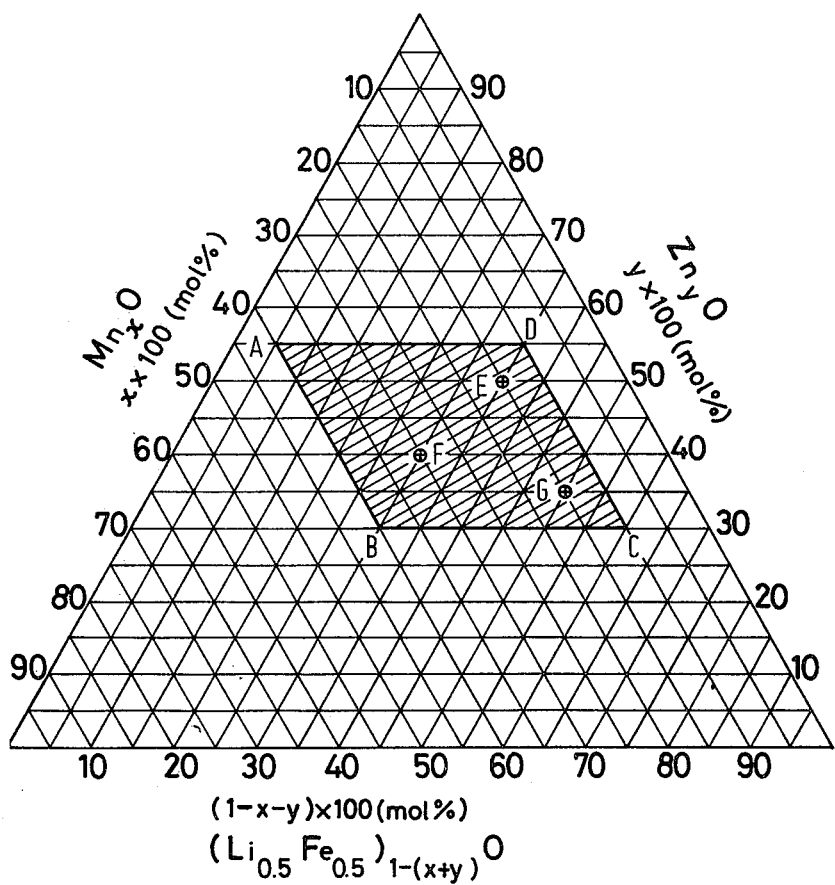
FIG. 1 is a triangular coordinate graph illustrating the compositions of ferrite single crystals produced according to the present invention.

FIG. 1 illustrates that the ferrite single crystals in accordance with the present invention in which a is 0 are preferably composed so as to have a composition bounded by the area ABCD. While such ferrite single crystals have no cobalt, the improved ferrite crystals of the present invention may contain predetermined amounts of cobalt as will be apparent from a succeeding portion of this description.

Figure 2B:
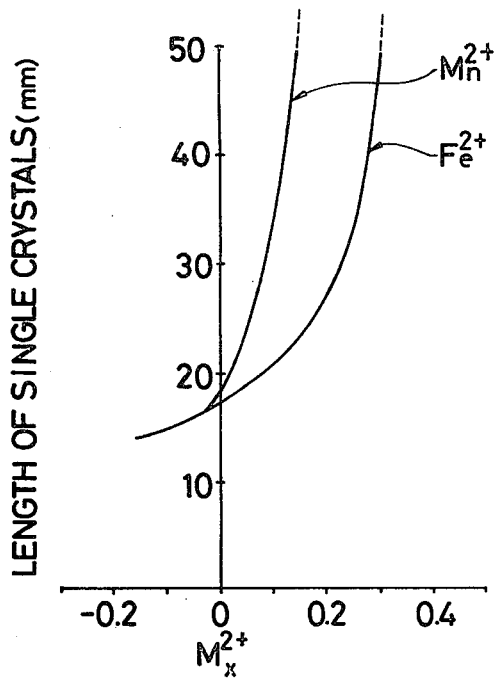
FIG. 2B is a graph illustrating the effect of variations in length of the single crystals as a function of the amounts of $Mn^{2+}$ and $Fe^{2+}$.
Figure 2A:
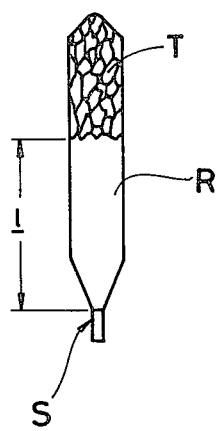
FIG. 2A is a representation of a crystal grown from a seed crystal, indicating the length of the single crystal.

In preparing conventional ferrite single crystals, as illustrated in FIG. 2A, it has often been found that as a single crystal R grows from the seed crystal S to a certain length l, it suddenly changes into a form of polycrystals T beyond such length. The addition of $Mn^{2+}$ to the ferrite single crystals in accordance with the present invention serves to prevent the polycrystallization of a single crystal.

FIG. 2B illustrates that when $Mn^{2+}$ is added in an amount such as x is 0.1 or higher, a single crystal grows effectively to its full length. The addition of $Fe^{2+}$ has a similar effect of preventing the polycrystallization of a single crystal. The effect of adding $Fe^{2+}$, however, is smaller than the effect produced by the addition of $Mn^{2+}$, as shown in FIG. 2B. This graph shows the results produced with respect to the following composition:

$$(Li_{0.5}Fe_{0.5})_{0.5-x}M^{2+}{}_xZn_{0.5}Fe_{2.0}O_4$$

where M is either Fe or Mn.

It has also been found that the specific resistance of the resulting single crystal is rendered too low.

Figure 3:
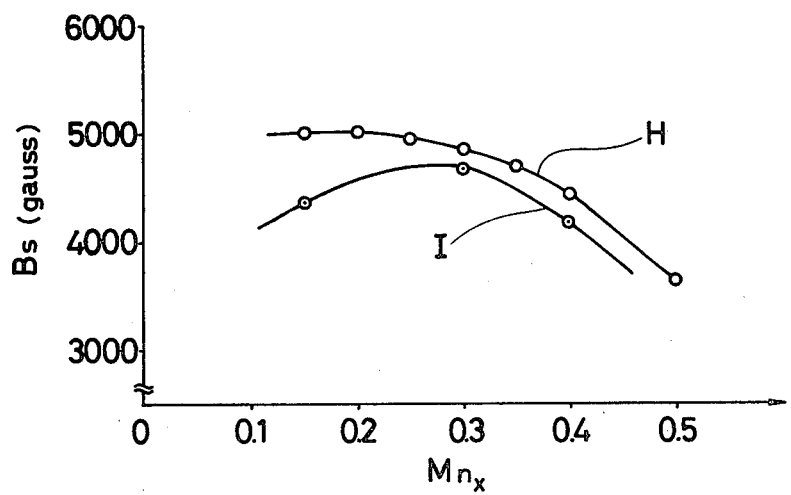
FIG. 3 is a graph illustrating variations in the values of Bs in relation to the amounts of Mn in two compositions containing no cobalt, and varying amounts of Zn, respectively.

The upper limit of the amount of $Mn^{2+}$ is determined on the basis of the magnetic performance of the resulting ferrite single crystal. As the amount of $Mn^{2+}$ is increased, the Curie point is decreased and the saturation flux density (Bs) at room temperature is decreased, as shown in FIG. 3. In this figure, the ferrite single crystals have the composition:

$$(Li_{0.5}Fe_{0.5})_{1-(x+y)}Mn_xZn_yFe_{2.0}O_4,$$

with varying amounts of Zn such that y=0.35 (line H) and 0.40 (line I). It was found that as the amounts of x are increased to approximately 0.4, the saturation flux density can still be maintained at a relatively high level.

Figure 4:
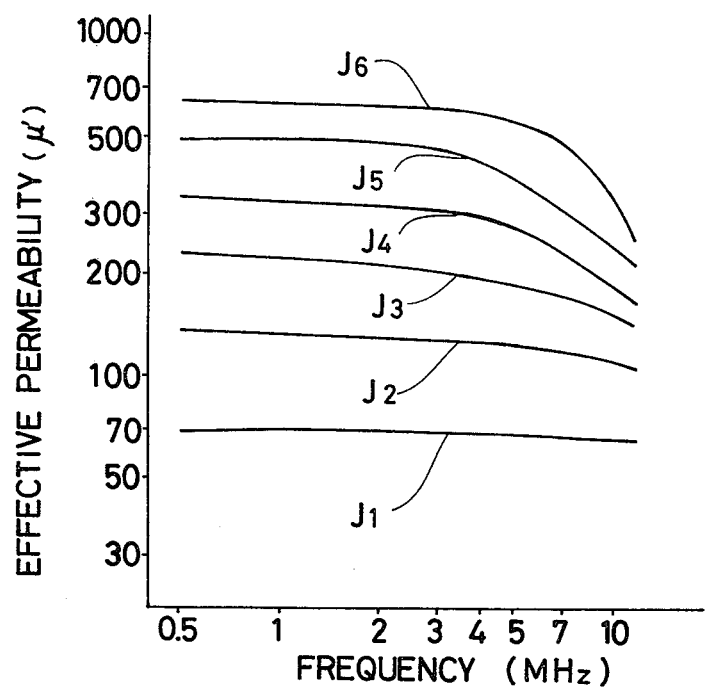
FIG. 4 is a graph illustrating the effect of variations in effective permeability ($\mu'$) with frequency (MHz) in two ferrite single crystals.

The amount of $Zn^{2+}$ is significant in determining the magnetic performance such as the crystal magnetic anisotropy constant ($K_1$), the effective permeability ($\mu'$), the saturation flux density (Bs) and the magnetostriction constant ($\lambda$) in desired ranges. Where the amount of $Zn^{2+}$ represented by y is smaller than the lower limit, the effective permeability is rendered too low as shown in FIG. 4. This drawing illustrates the increase in effective permeability with increase in amounts of $Zn^{2+}$ in tests which were conducted with respect to ferrite single crystals containing no $Mn^{2+}$ and having the following composition:

$$(Li_{0.5}Fe_{0.5})_{1-y_1}Zn_{y_1}Fe_{2.0}O_4$$

wherein $y_1$ is in the range from 0 to 0.6.

Figure 5:
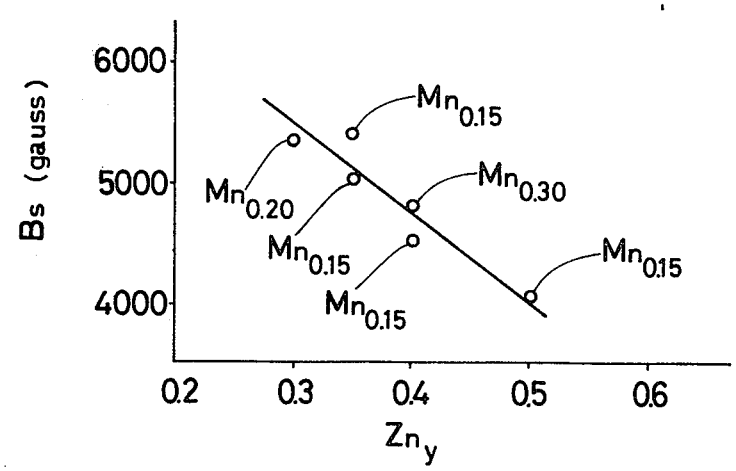
FIG. 5 is a graph illustrating the variations in Bs values with relation to the amounts of Mn and Zn present.

In FIG. 4, the curved lines $J_1$ to $J_6$, inclusive, represent y values of 0.0, 0.2, 0.3, 0.4, 0.5, and 0.6, respectively. It was further found in connection with FIG. 5 that ferrite single crystals having the following composition:

$$(Li_{0.5}Fe_{0.5})_{1-(x+y)}Mn_xZn_yFe_{2.0}O_4$$

exhibit a decrease in saturation flux density (Bs) with increasing amounts of $Zn^{2+}$. FIG. 5 also shows where the amount y of $Zn^{2+}$ exceeds the upper limit, the saturation flux density (Bs) at room temperature is excessively small. It was further found that excessive quantity of $Zn^{2+}$ causes a decrease in the Curie point to a very low level. Thus, it is necessary to add $Zn^{2+}$ in an amount not larger than y=0.55 in order to keep both the saturation flux density (Bs) at room temperature and the Curie point at relatively high levels.

Figure 6:
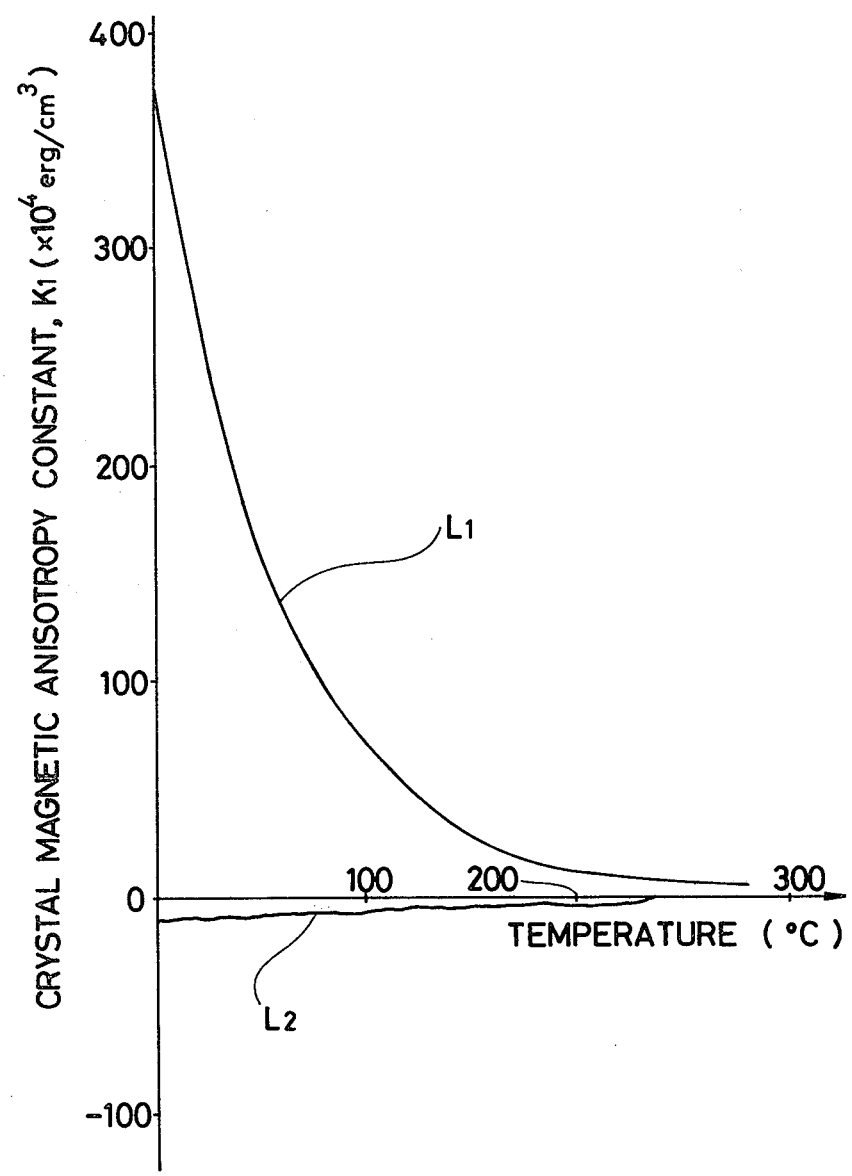
FIG. 6 is a graph illustrating the changes in crystal magnetic anisotropy constant $K_1$ with temperature for Co-ferrite and Li-ferrite.

The addition of $Co^{2+}$ serves to control the crystal magnetic anisotropy constant ($K_1$) and effectively controls the dependence of effective permeability upon temperature and frequency in desired ranges. The use of $Co^{2+}$ in a predetermined amount can result in the compensation of the negative $K_1$ value of the Li—Zn series ferrites and the positive $K_1$ value of the cobalt ferrites as shown in FIG. 6, thereby enabling the $K_1$ value to become small in a range of practical temperatures and improving the effective permeability a sufficient extent. In FIG. 6, the curve line $L_1$ illustrates a cobalt ferrite and the curved line $L_2$ indicates the Li-ferrite.

Figure 7A:
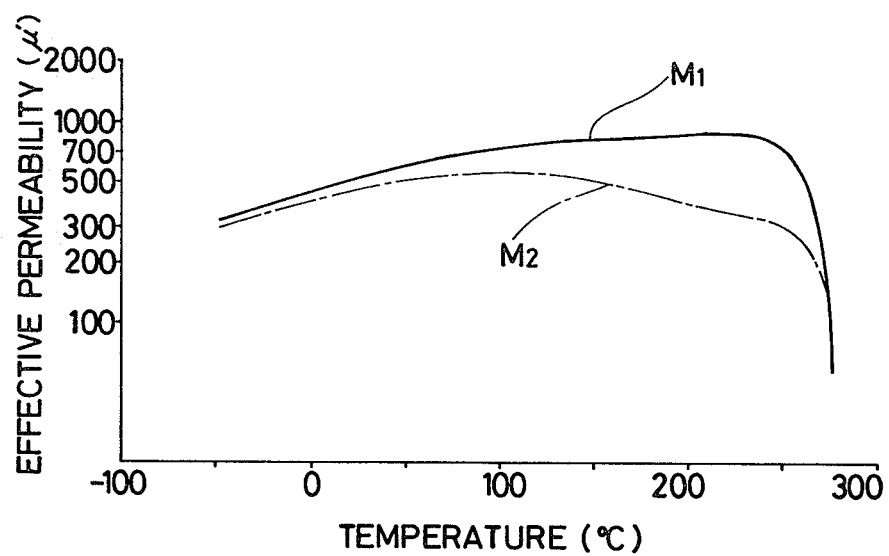
FIGS. 7A and 7B are graphs illustrating the variations in effective permeability with temperature for ferrites with and without cobalt, respectively.

In FIG. 7A, there is shown the effect of temperature on the effective permeability of the following composition:

$$Li_{0.175}Mn_{0.30}Zn_{0.35}Fe_{2.175}O_4.$$

From this curve it will be seen that the effective permeability dropped substantially at about 250° C. This curve also shows that a cut of the single crystal without processing, at a thickness of 0.950 mm increases its effective permeability gradually with elevating temperatures up to about 200° C. as shown by the curved line $M_1$, whereas a cut thereof with processing at a thickness of 0.232 mm does not increase the effective permeability and decreases gradually from about 100° C. to 220° C. (curved line $M_2$).

Figure 7B:
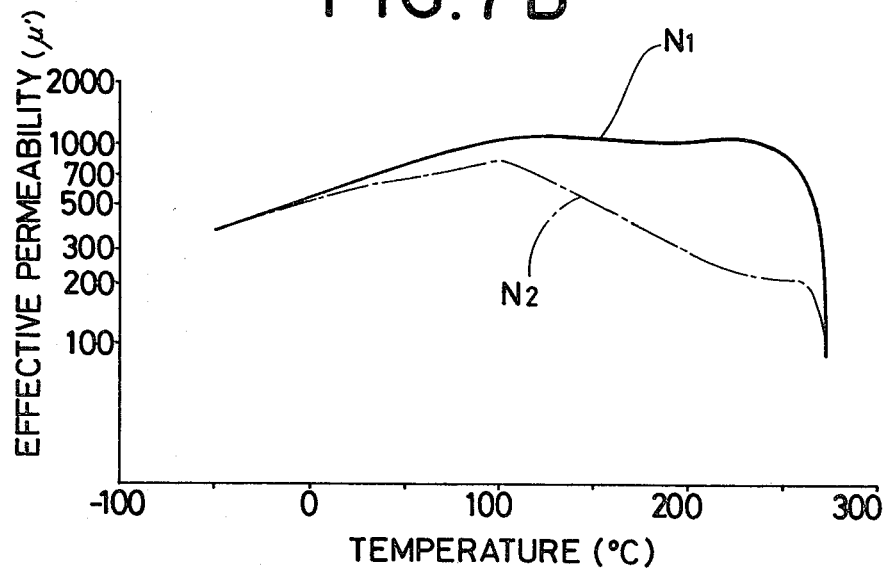

In FIG. 7B, there is illustrated the temperature dependence of effective permeability of a single crystal having the following composition:

$Li_{0.174}Mn_{0.30}Zn_{0.35}Co_{0.007}Fe_{2.174}O_4$.

From this curve it will be seen that the effective permeability was down substantially at about 270° C. A cut of a single crystal without processing at a thickness of 0.976 mm provides a result similar to the cut $M_1$ shown in FIG. 7A, as shown by the curved line $N_1$. A cut thereof with processing at a thickness of 0.246 mm had its effective permeability decreased substantially at 100° C. as shown by the curved line $N_2$.

Figure 8:
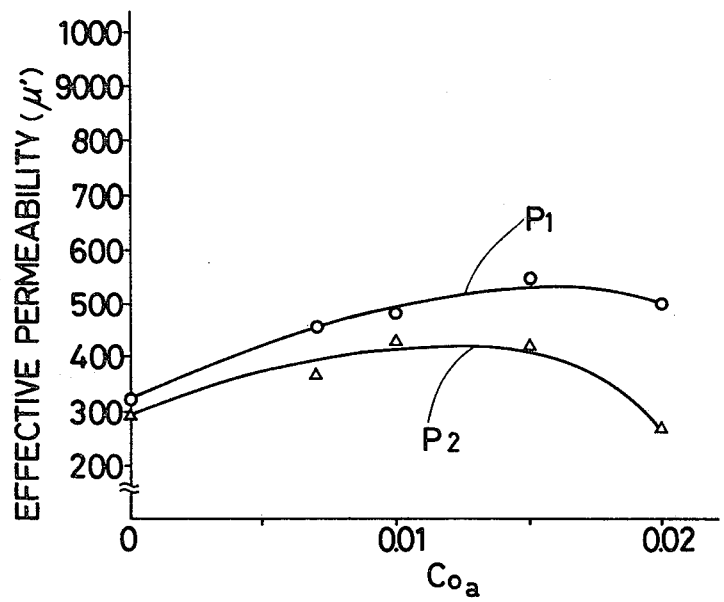
FIG. 8 is a graph illustrating variations in effective permeability depending on the amounts of cobalt present in cobalt ferrites.
Figure 9:
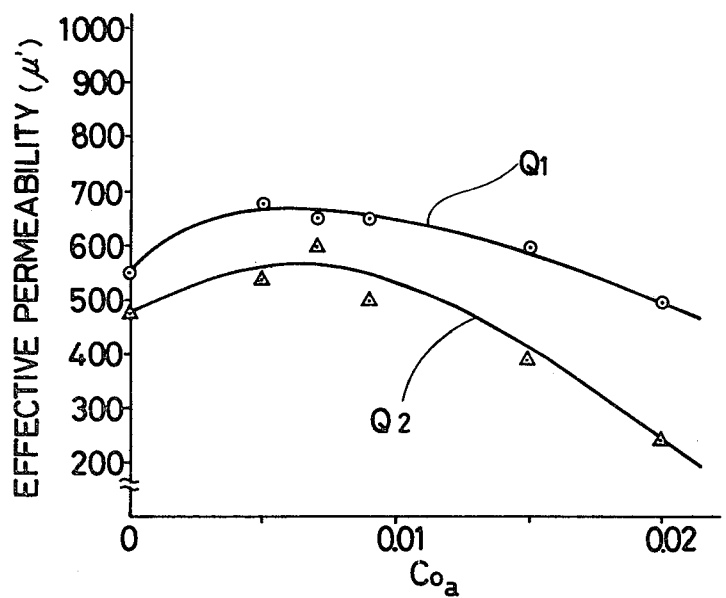
FIG. 9 is a graph illustrating variations in effective permeability with respect to amounts of cobalt present in ferrites.

FIGS. 8 and 9 show that the addition of $Co^{2+}$ beyond certain amounts has a tendency to decrease the effective permeabilities. In FIG. 8, the ferrite single crystal had the following composition:

$[(Li_{0.5}Fe_{0.5})_{0.5}Mn_{0.15}Zn_{0.35}]_{1-a}Co_aFe_{2.0}O_4$.

It was found that a cut of the single crystal without processing increases its effective permeability at room temperature with increasing additions of $Co^{2+}$ up to a value of a of 0.02 as shown by the curved line $P_1$, whereas a cut with processing decreased its effective permeability at room temperature to a substantial extent when the amount of $Co^{2+}$ exceeded a value of a being 0.015 as shown by the curved line $P_2$.

The ferrite single crystal tested in FIG. 9 had the following composition:

$[(Li_{0.5}Fe_{0.5})_{0.35}Mn_{0.30}Zn_{0.35}]_{1-a}Co_aFe_{2.0}O_4$.

It was found that the effective permeabilities at room temperature decreased considerably when the amount of $Co^{2+}$, represented by a, was 0.01 in each case, as shown by the curved line $Q_1$ which represents a cut of the single crystal without processing and in the curved line $Q_2$ which represents a cut of single crystal with processing.

PREPARATION OF THE FERRITE SINGLE CRYSTALS

Figure 10:
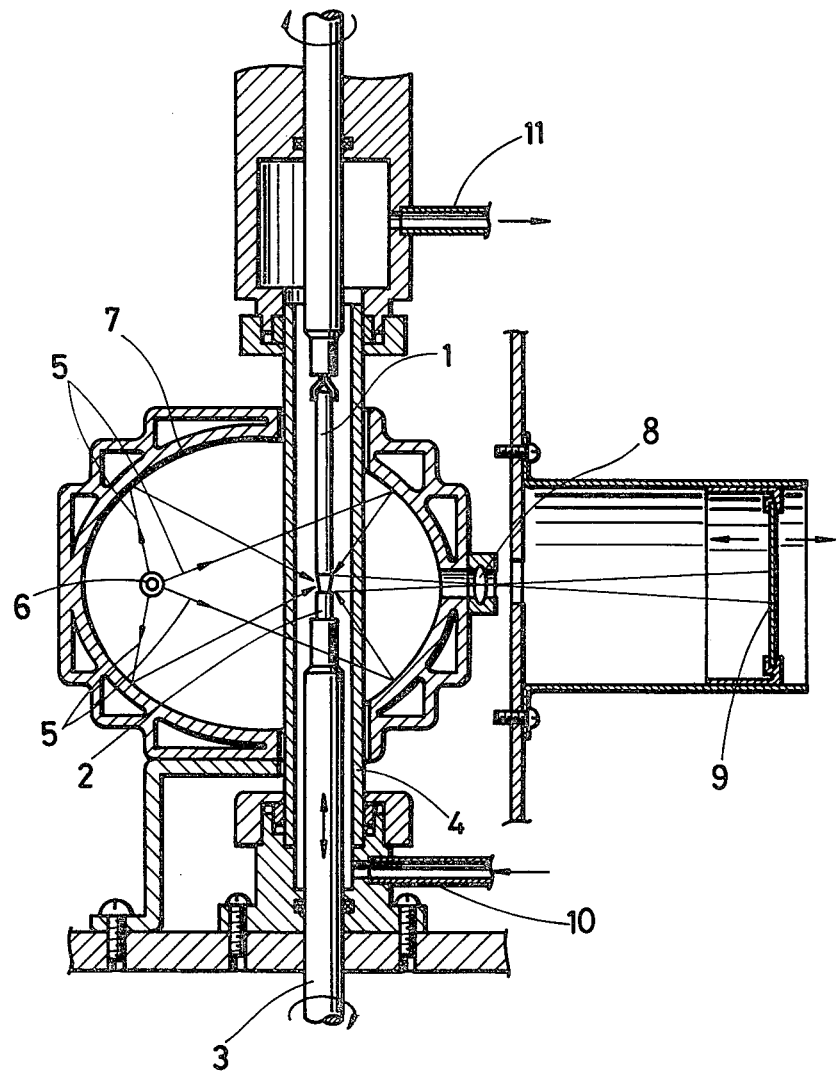
FIG. 10 is a cross-sectional view illustrating an infrared concentration heating type floating zone apparatus which can be employed for the growth of ferrite single crystals in accordance with the present invention.

A mixture of $Li_2CO_3$, MnO, ZnO and $Fe_2O_3$ each having a purity of greater than 99.9% was mixed in the desired molar ratio, ball milled, and formed under a pressure of 0.5 to 1 ton/cm² into a columnar form having a height of 40 mm and a diameter of 10 mm. The form was then fired in air at 1,200° to 1,350° C. to produce a raw material for growing a single crystal. With this raw material, the growth of the single crystal was carried out by means of an infrared concentration heating type floating zone apparatus as shown in FIG. 10. The floating zone apparatus is so constructed that the raw material 1 and the seed crystal 2 are held by means of a holding rod 3 which is arranged to rotatably move downward in a vertical silica tube 4. Infrared rays 5 from a halogen lamp 6 mounted in a rotary ellipsoidal mirror 7 enclosing the silica tube 4 are positioned to concentrate on the raw material 1. This system heats the raw material 1 in a concentrated manner and melts it to thereby grow a ferrite single crystal. The floating zone apparatus is provided with a lens 8 capable of projecting a view of the growth of the single crystal on a screen 9. A gas for the growing atmosphere is supplied into the silica tube 4 from an inlet conduit 10 provided at the lower end of the tube and the gas flows upwardly in the tube to an outlet conduit 11 from which the gas is discharged.

With the raw material 1 and the seed crystal 2 held in the manner described, the heating for about 1 hour allows a melt zone to be formed during this period. The raw material 1 and the seed crystal 2 are rotated in directions opposite to each other at a rate of about 10 to 60 rpm and transferred downwardly at a velocity of 5 to 30 mm per hour with synchronization. The single crystal is grown at an oxygen partial pressure ranging from 1 to 5 atmospheres. The grown crystal is readily oxidized and cracked and it is heated at 1,000° C. or higher with a sub-heater mounted below the focus of the halogen lamp 6. After the growth of the single crystal, it is then cooled to room temperature over a period of about 10 hours.

The raw material 1 has the following composition:

$(Li_pMn_qZn_rCo_sFe_t)_3O_4$ where p is 0.0485, q is 0.075 to 0.468, r is from 0.35 to 0.50, s is from 0 to 0.02, and t is from 2.0485 to 2.250.

The following examples describe ferrite single crystals which have superior magnetic performance and produced according to the above-described growing operation, although it should be understood that the present invention is not limited to this specific growing technique.

EXAMPLE 1

A ferrite single crystal having the following composition exhibited a low magnetostriction:

$(Li_{0.5}Fe_{0.5})_{0.35}Mn_{0.15}Zn_{0.50}Fe_{2.0}O_4$.

This composition corresponds to the point E in the triangular coordinates of FIG. 1. This single crystal was grown from raw material prepared from a mixture of 4.80 mol% of $Li_2CO_3$, 8.22 mol% of MnO, 27.40 mol% of ZnO, and 59.59 mol% of $Fe_2O_3$ under the following conditions:
$PO_2 = 4$ atmospheres
growth velocity = 15 mm per hour.

The single crystal grown in the growth direction [100] or [111] had the following characteristics:
$Bs = 4,027$ gauss (at room temperature)
$Tc = 224°$ C.
$\lambda_{100} = -3.3 \times 10^{-6}$
$\lambda_{111} = +2.9 \times 10^{-6}$
$\lambda_s = +0.45 \times 10^{-6}$
$\rho = 2-3$ $\Omega$-cm
$\mu' = 692$ (f:1 MHz), 378 (f:3 MHz), 239 (f:5 MHz), 168 (f:10 MHz)

EXAMPLE 2

A ferrite single crystal of the following composition had a low processing deterioration in effective permeability ($\mu'$):

$(Li_{0.5}Fe_{0.5})_{0.344}Mn_{0.30}Zn_{0.35}Co_{0.006}Fe_{2.0}O_4$

This ferrite single crystal was prepared from a mixture of 4.79 mol% of $Li_2CO_3$, 16.4 mol% MnO, 19.1 mol% ZnO, 0.383 mol% of CoO and 59.28 mol% of $Fe_2O_3$ under the same conditions as in Example I. The resulting single crystal had the following characteristics:
$Bs = 4,850$ gauss (at room temperature)
$Tc = 270°$ C.
$\lambda_{100} = -18.2 \times 10^{-6}$
$\lambda_{111} = +4.6 \times 10^{-6}$
$\lambda_s = -4.5 \times 10^{-6}$ $\mu' = 600$ (f:1 MHz), 530 (f:3 MHz), 340 (f:5 MHz), 190 (f:10 MHz)

EXAMPLE 3

A ferrite single crystal having a high effective permeability was made from the following composition:

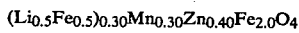
$(Li_{0.5}Fe_{0.5})_{0.30}Mn_{0.30}Zn_{0.40}Fe_{2.0}O_4$

This composition corresponds to the point F in the triangular coordinate of FIG. 1. The single crystal was grown from the raw material prepared from a mixture of 4.054 mol% of $Li_2CO_3$, 16.216 mol% of MnO, 21.621 mol% of ZnO and 58.108 mol% of $Fe_2O_3$ under the same conditions as in the previous examples. The resulting single crystal had the following characteristics:

Bs = 4,762 gauss (at room temperature)
Tc = 229° C.
$\lambda_{100} = -12.5 \times 10^{-6}$
$\lambda_{111} = +3.7 \times 10^{-6}$
$\lambda_s = -2.8 \times 10^{-6}$
$\mu' = 733$ (f:1 MHz), 350 (f:3 MHz), 264 (f:5 MHz), 229 (f:10 MHz).

EXAMPLE 4

A ferrite single crystal having a high saturation flux density (Bs) was made up from the following composition:

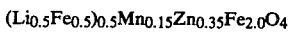
$(Li_{0.5}Fe_{0.5})_{0.5}Mn_{0.15}Zn_{0.35}Fe_{2.0}O_4$

This composition corresponds to the point G of the triangular coordinate of FIG. 1. The single crystal was grown from a raw material prepared from a mixture of 7.14 mol% of $Li_2CO_3$, 8.57 mol% of MnO, 20.00 mol% of ZnO and 64.28 mol% of $Fe_2O_3$ under the same conditions as in the previous examples. The single crystal had the following characteristics:

Bs = 5,405 gauss (at room temperature)
Tc = 335° C.
$\lambda_{100} = -13.9 \times 10^{-6}$
$\lambda_{111} = +10.1 \times 10^{-6}$
$\lambda_s = +0.5 \times 10^{-6}$
$\mu' = 324$ (f:1 MHz), 196 (f:3 MHz), 112 (f:10 MHz)

The single crystal ferrites produced according to the present invention have superior magnetic properties and are obtained in a size sufficiently large so that they can be used in making up the entire magnetic head or at least that portion of the head which contains the magnetic gap which contacts the magnetic tape. The ferrite single crystals of the present invention provide a superior magnetic head having superior magnetic performance and abrasion resistance, and less deviation in these properties when the proper orientation of the crystal is chosen.

It should be evident that various modifications can be made to the described embodiments without departing from the scope of the present invention.

We claim as our invention:

1. A ferrite single crystal having the composition:

$[(Li_{0.5}Fe_{0.5})_{1-(x+y)}Mn_xZn_y]_{1-a}Co_aFe_{2.0}O_4$ wherein x is from 0.1 to 0.4, y is from 0.3 to 0.55, and a is from 0 to 0.015.

2. A ferrite single crystal according to claim 1, wherein a is from 0.005 to 0.015.

3. A ferrite single crystal according to claim 1, wherein x is 0.15, y is 0.50, and a is 0.

4. A ferrite single crystal according to claim 1, wherein x is B 0.30, y is 0.35, and a is 0.006.

5. A ferrite single crystal according to claim 1, wherein x is 0.30, y is 0.40, and a is 0.

6. A ferrite single crystal according to claim 1, wherein x is 0.15, y is 0.35, and a is 0.

7. A magnetic head comprising a ferrite single crystal having the composition:

$[(Li_{0.5}Fe_{0.5})_{1-(x+y)}Mn_xZn_y]_{1-a}Co_aFe_{2.0}O_4$ wherein x is from 0.1 to 0.4, y is from 0.3 to 0.55, and a is from 0 to 0.015.

8. A magnetic head according to claim 7, wherein the ferrite single crystal has a composition in which a is from 0.005 to 0.015.

9. A magnetic head according to claim 7, wherein x is 0.15, y is 0.50, and a is 0.

10. A magnetic head according to claim 7, wherein x is 0.30, y is 0.35, and a is 0.006.

11. A magnetic head according to claim 7, wherein x is 0.30, y is 0.40, and a is 0.

12. A magnetic head according to claim 7, wherein x is 0.15, y is 0.35, and a is 0.

* * * * *